United States Patent [19]
Okuno et al.

[11] Patent Number: 5,499,600
[45] Date of Patent: Mar. 19, 1996

[54] METHODS FOR COMPOUND SEMICONDUCTOR CRYSTAL GROWTH FROM SOLUTION

[75] Inventors: Yasuo Okuno; Shotaro Tomita; Hiroyuki Kato, all of Yokohama, Japan

[73] Assignees: Stanley Electric Co., Ltd., Tokyo; Kanagawa Academy of Science and Technology, Kawasaki, both of Japan

[21] Appl. No.: 358,864

[22] Filed: Dec. 19, 1994

[30] Foreign Application Priority Data

Dec. 24, 1993 [JP] Japan .................................. 5-327010
Dec. 24, 1993 [JP] Japan .................................. 5-327011

[51] Int. Cl.⁶ .................................................. C30B 28/04
[52] U.S. Cl. ............................. 117/68; 117/81; 117/922
[58] Field of Search ................................ 117/36, 68, 81, 117/100, 109, 922

[56] References Cited

FOREIGN PATENT DOCUMENTS 2311393  12/1990  Japan .
2311392  12/1990  Japan .
4026583   1/1992  Japan ..................................... 117/68
4182397   6/1992  Japan ..................................... 117/68
6-8235    2/1994  Japan .

*Primary Examiner*—R. Bruce Breneman
*Assistant Examiner*—Felisa Garrett
*Attorney, Agent, or Firm*—Frishauf, Holtz, Goodman, Langer & Chick

[57] ABSTRACT

A crystal solution growth method for growing a crystal by providing a temperature difference between the higher and lower regions of a solvent, and disposing a source crystal at a high temperature region of the solution and a seed crystal at a low temperature region of the solution. The crystal solution growth method includes the steps of: placing the seed crystal on a recess of a heat sink, the heat sink being disposed under the solvent and the recess being defined on the top surface of the heat sink; placing a seed stopper on the seed crystal to fix the seed crystal, the seed stopper having a tubular part with an inner diameter generally same as the seed crystal and a seed crystal fixing part for fixing the seed crystal formed at one end of, the tubular part on the seed crystal side; and forming a temperature difference between the higher and lower regions of the solvent and growing a crystal oil the surface of the seed crystal.

15 Claims, 9 Drawing Sheets

5,499,600

METHODS FOR COMPOUND SEMICONDUCTOR CRYSTAL GROWTH FROM SOLUTION

BACKGROUND OF THE INVENTION

1. Field of the Invention

The present invention relates to crystal growth from solution.

As a bulk crystal growth technique for a compound semiconductor having a high vapor pressure, particularly group II–VI compound semiconductors, solution growth of crystals has been expected to become prominent because it can use a low growth temperature.

2. Description of the Related Art

Group II–VI compound semiconductors have a high melting point and a vapor pressure of its constituent elements is high. Therefore, a melt crystal growth chamber is required to be resistive against a high pressure, and in addition a crystal grown at a high growth temperature is likely to have a high density of crystal defects.

If solution growth is used, it is possible to lower a crystal growth temperature of II–VI group compound semiconductor, and a crystal of good quality can be expected. It has been proposed to use Group II or VI elements of a group II–VI compound semiconductor as a solvent.

FIG. 8 shows an example of the structure of a conventional solution growth apparatus for a group II–VI compound semiconductor. The left side of FIG. 8 shows a crystal growth apparatus in cross section, and the right side is a graph showing a temperature distribution in the crystal growth apparatus.

A crystal growth tube 1 is made of two quartz tubes laving different diameters. At the initial stage, the upper end of the tube 1 is open. A heat sink 6 made of a material having a high thermal conductivity is entered to the lower portion of the crystal growth tube 1. The material of the heat sink 6 has preferably a thermal conductivity about 100 times as high as quartz.

The heat sink 6 is fixed to the crystal growth tube 1. A seed crystal wafer 5 having generally the same diameter as the heat sink 6 is placed on the top surface of the heat sink 6. A tubular seed stopper 4 having a predetermined length and the same outer diameter as the heat sink 6 is inserted and fixed to the crystal growth tube 1. Before source material is filled in, the crystal growth tube 1 is open, for example, at its upper portion.

Se-Te (Se and Te of a predetermined mixing ratio, solid in a room temperature) as a solvent 3 and ZnSe polycrystal as a source crystal 2 are loaded in the crystal growth tube 1. IF Se only is used as the solvent for ZnSe crystal growth, solubility of ZnSe into Se is low. Therefore, Te is added to Se to increase the ZnSe solubility. After the source crystal 2 and solvent 3 are loaded, the crystal growth tube 1 is evacuated and the opening is hermetically sealed.

The crystal growth ampoule tube 1 prepared as above is placed in an electric furnace of an externally heating type set with a temperature gradient shown at the right side of FIG. 8. The externally heating type electric furnace has a furnace tube 7 and a heater wire 8 wound around the tube 7. The crystal growth tube 1 is placed in a vertical space off the furnace tube The inside of the furnace tube 7 has a vertical temperature distribution high at the upper area and low at the lower area. The temperature at the position where the source crystal 2 is placed, is represented by Ts, and the temperature at the surface of the seed crystal 5 on which crystal grows, is represented by Tg, where Ts >Tg.

With the crystal growth tube 1 provided with such a temperature distribution, the source crystal 2 at the high temperature area dissolves in the solvent 3 to the saturated solubility at the high temperature area. The saturated solubility at a high temperature is higher than at a low temperature. Source crystal compositions dissolved in the solvent 3 move to the lower temperature area by diffusion so that the solution at the lower temperature area becomes oversaturated.

As the seed crystal 5 at time lower temperature area contacts the oversaturated solution, a crystal grows on the surface of the seed crystal 5. In this manner, a bulk crystal grows on the surface of the seed crystal 5.

Another example of the structure of a crystal growth tube is shown in FIG. 9. In this example, an ingot seed crystal 5 is placed on a heat sink 6 having the same diameter as the seed crystal 5. The seed crystal 5 is fixed to the crystal growth tube 1 by denting the side wail of the tube 1.

A conventional growth method explained with reference to FIG. 8 is, however, not satisfactory in practical use in that the outer diameter of a grown crystal is smaller than that of the seed crystal, and that if a grown crystal is used later as a seed crystal, the outer diameter of a crystal to be next grown becomes further smaller.

If the ingot seed crystal shown in FIG. 9 is used and a growth speed of crystal is low, the thickness of a crystal grown once is approximately in the same order of that of the ingot seed crystal. It is therefore difficult to increase the number of crystals from one mother crystal and to improve the manufacture efficiency.

With the conventional crystal growth method explained with FIG. 8, the solvent moves lower to the side wall and bottom of the seed crystal if there is a small gap between the seed crystal and heat sink. The solvent moving to the bottom of the seed crystal may diffuse in the crystal, or dissolve the seed crystal at the high temperature area and precipate the dissolved crystal on the heat sink at the low temperature area. The solvent diffused in the grown crystal forms inclusions.

In the case of the conventional crystal growth apparatus shown in FIG. 8, the seed crystal on the heat sink is fixed by the quartz seed stopper 4. The thermal expansion coefficient of quartz is $0.5 \times 10^{-6}$/K which is smaller than $7.55 \times 10^{-6}$/K of ZnSe.

As a result, the expansion of the seed crystal and heat sink of the crystal growth tube in a high temperature atmosphere is greater than the quartz crystal growth tube. This expansion difference exerts a compression stress to the seed crystal at the position in contact with the seed crystal stopper 4. The crystal structure of the seed crystal is therefore degraded. The crystal grown on the degraded seed crystal has also a degraded crystal structure.

SUMMARY OF THE INVENTION

It is an object of the present invention to provide a crystal growth technique capable of growing a crystal having the same diameter as a seed crystal wafer.

It is another object of the present invention to provide a crystal growth technique for a group II–VI compound bulk semiconductor, having less inclusions and capable of preventing solvent from being mixed with a grown crystal.

It is still another object of the present invention to provide a crystal growth technique for a group II–VI compound semiconductor capable of releasing a stress applied to a seed crystal during crystal growth and realizing a good crystal structure.

According to one aspect of the present invention, there is provided a crystal solution growth method for growing a crystal by providing a temperature difference between the higher and lower regions of a solvent, and disposing a source crystal at a high temperature region of the solution and a seed crystal at a low temperature region of the solution. The crystal solution growth method includes the steps of: placing the seed crystal on a recess of a heat sink, the heal sink being disposed under the solvent and the recess being defined on the top surface of the heat sink; placing a seed stopper on the seed crystal to fix the seed crystal, the seed stopper having a tubular part with an inner diameter generally same as the seed crystal and a seed crystal fixing part for fixing the seed crystal, the seed crystal fixing part being formed at one end of the tubular part on the seed crystal side; and forming a temperature difference between the higher and lower regions of the solvent and growing a crystal on the surface of the seed crystal.

The recess has an inner diameter slightly larger than the diameter of the seed crystal, and the depth thereof is generally equal to the thickness of the seed crystal, or larger than the thickness with a difference therebetween being 20 μm or less. The seed crystal fixing step may include the steps of: placing the seed crystal fixing part having an opening on the heat sink, with the opening being disposed concentrically with the recess, the opening having a diameter slightly smaller than the diameter of the seed crystal; and fixing the seed crystal fixing part by the tubular part.

According to another aspect of the present invention, there is provided a crystal solution growth method wherein a temperature difference is formed between the higher and lower regions of a solvent including at least one constituent element of a compound semiconductor crystal to be grown, a source crystal is disposed at a high temperature region of the solution, and a crystal is grown at a low temperature region of the solution. The crystal solution growth method includes the steps of: placing a member containing another constituent element different from at least one constituent element of the crystal to be grown, and a seed crystal, in this order, respectively on the top surface of a heat sink disposed under the solvent; pressing the outer periphery of the seed crystal by a tubular seed stopper to fix the seed crystal to the heat sink; and growing a single crystal from solution on the surface of the seed crystal.

The inner diameter of the tubular seed stopper for fixing the seed crystal is made equal to the diameter of the seed crystal. A grown crystal having the same diameter of the seed crystal wafer can therefore be obtained.

The seed crystal fixing part formed at the inner circumferential end of the seed stopper on the seed crystal side allows the seed crystal to be reliably fixed.

The seed crystal can be reliably fixed by setting the depth of the recess on which the seed crystal is placed, to be generally equal to, or slightly larger than, the depth of the seed crystal. Since the top surface of the seed crystal is generally flush with, or lower than, the upper peripheral edge of the recess, a compression stress caused by a thermal expansion coefficient difference at a high temperature is not applied to the seed crystal, or even if some stress is applied, most of the stress are applied to the upper peripheral edge of the recess, thereby relieving the stress otherwise applied to the seed crystal.

It is therefore possible to prevent the crystal structure of the seed crystal from being degraded by the stress otherwise applied thereto at a high temperature during crystal growth. A grown crystal having a good crystal structure can therefore be obtained.

The member containing a constituent element of a grown crystal other than that contained in the solvent is interposed between the seed crystal and the heat sink, to prevent clearances from being formed on the bottom of the seed crystal. It is possible to suppress the solvent to move lower to the bottom of the seed crystal. Even if there is a clearance between the seed crystal and the member and the solvent enters the clearance, the constituent element contained in the solvent reacts with the member. It is therefore possible to prevent the solvent from being diffused in the grown crystal and forming inclusions.

A thin film containing the constituent element same as the member may be formed on the bottom of the seed crystal to thereby prevent the generation of clearances on the bottom of the seed crystal and the motion of the solvent lower to the bottom of the seed crystal.

With the crystal solution growth described above, a cylindrical single crystal having the same diameter as the seed crystal can be formed. Crystals can be efficiently formed by using a grown crystal as a new seed crystal.

DETAILED DESCRIPTION OF THE PREFERRED EMBODIMENTS

In the following, crystal growth for a group II–VI compound semiconductor, ZnSe, will be explained by way of example.

Figure 1:
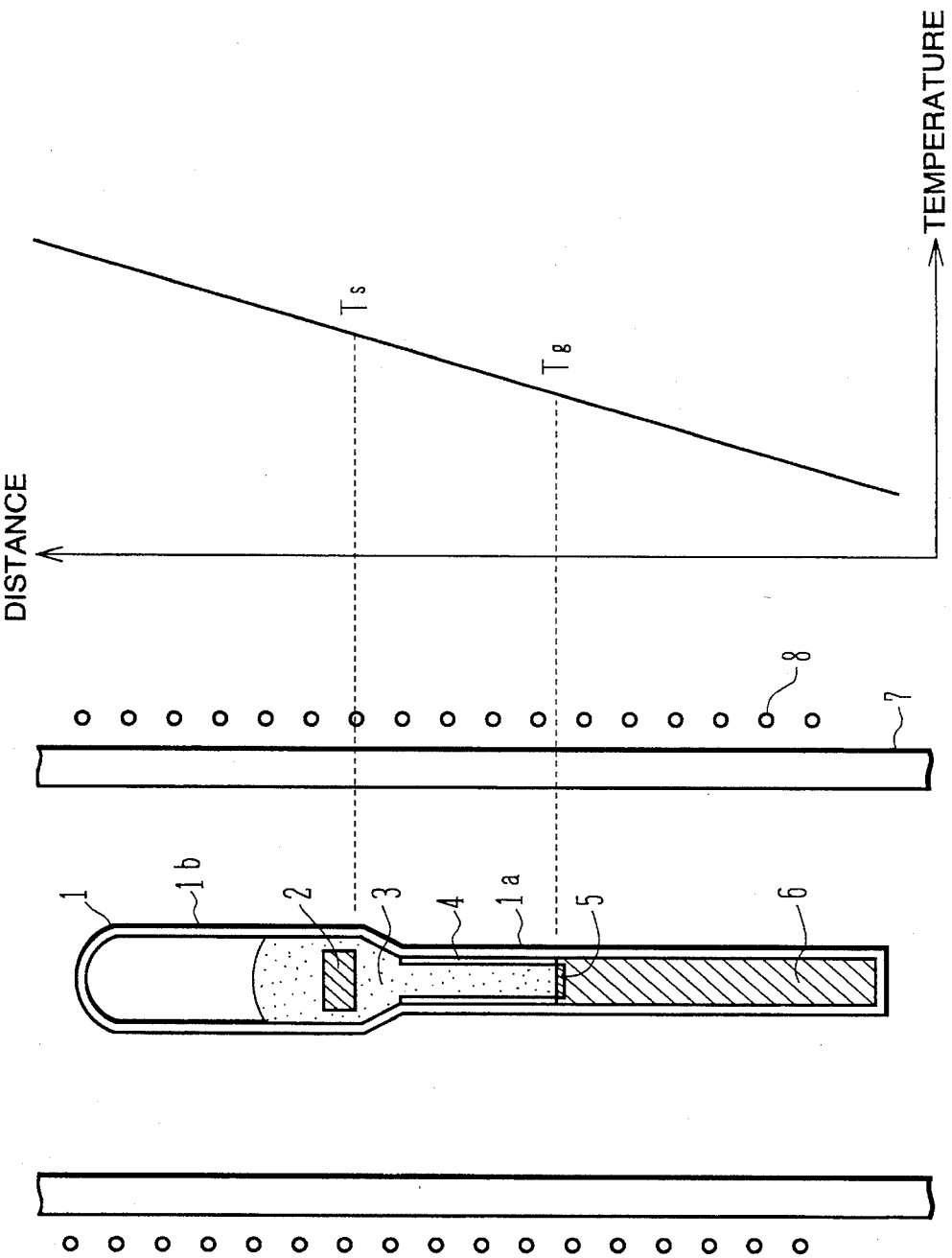
FIG. 1 is a cross sectional view of a crystal solution growth apparatus and a temperature distribution graph, explaining a crystal solution growth according to an embodiment of the invention.

FIG. 1 shows a crystal growth apparatus according to an embodiment of the invention. The left side of FIG. 1 is a cross sectional view of the crystal growth apparatus, and the right side thereof is a graph showing a temperature distribution in the furnace.

A crystal growth tube 1 is prepared by coupling a quartz tube 1a having a small diameter and a quartz tube 1b having a large diameter. At this stage, the upper portion of the large diameter quartz tube 1b is maintained open.

The surface of the growth tube 1 is etched and cleaned by hydrofluoric acid. A heat sink 6 made of a material having a high thermal conductivity, such as carbon, is inserted to the bottom of the crystal growth tube 1 with the cleaned surface. Thereafter, the crystal growth tube 1 is baked in a vacuum. The carbon has a thermal conductivity of about 100 times as large as that of quartz. It is preferable to select a material as the heat sink which has a thermal conductivity at least about 50 times as high as that of the growth tube.

The heat sink 6 has notches partially formed on the outer surface thereof so that the growth tube 1 is deformed in conformity with the notches during the vacuum baking and the heat sink 6 is fixed to the growth tube 1. The heat sink 6 has a circular recess having a depth of 0.1 to 0.5 mm formed in the top surface thereof, and the bottom surface is worked to have a flat mirror surface. Further details of the heat sink may be found in JP-B 6-8235, which is incorporated herein by reference.

As a seed crystal 5, a ZnSe single crystal wafer is prepared which has the (1 1 1) crystal surface and a diameter slightly smaller than the circular recess formed in the top surface of the heat sink 6. A ZnSe single crystal having a crystal surface other than the (1 1 1) surface may be used. The seed crystal 5 is mirror-polished and washed to follow mirror etching.

The seed crystal 5 prepared as above is placed on the circular recess formed in the top surface of the heat sink 6 to position it at the center of the recess.

A tubular seed stopper 4 having the same outer diameter as the heat sink 6 and the same inner diameter as the outer diameter of the seed crystal 5, is inserted and adhered to the crystal growth tube 1 by a melting process.

Figure 2:
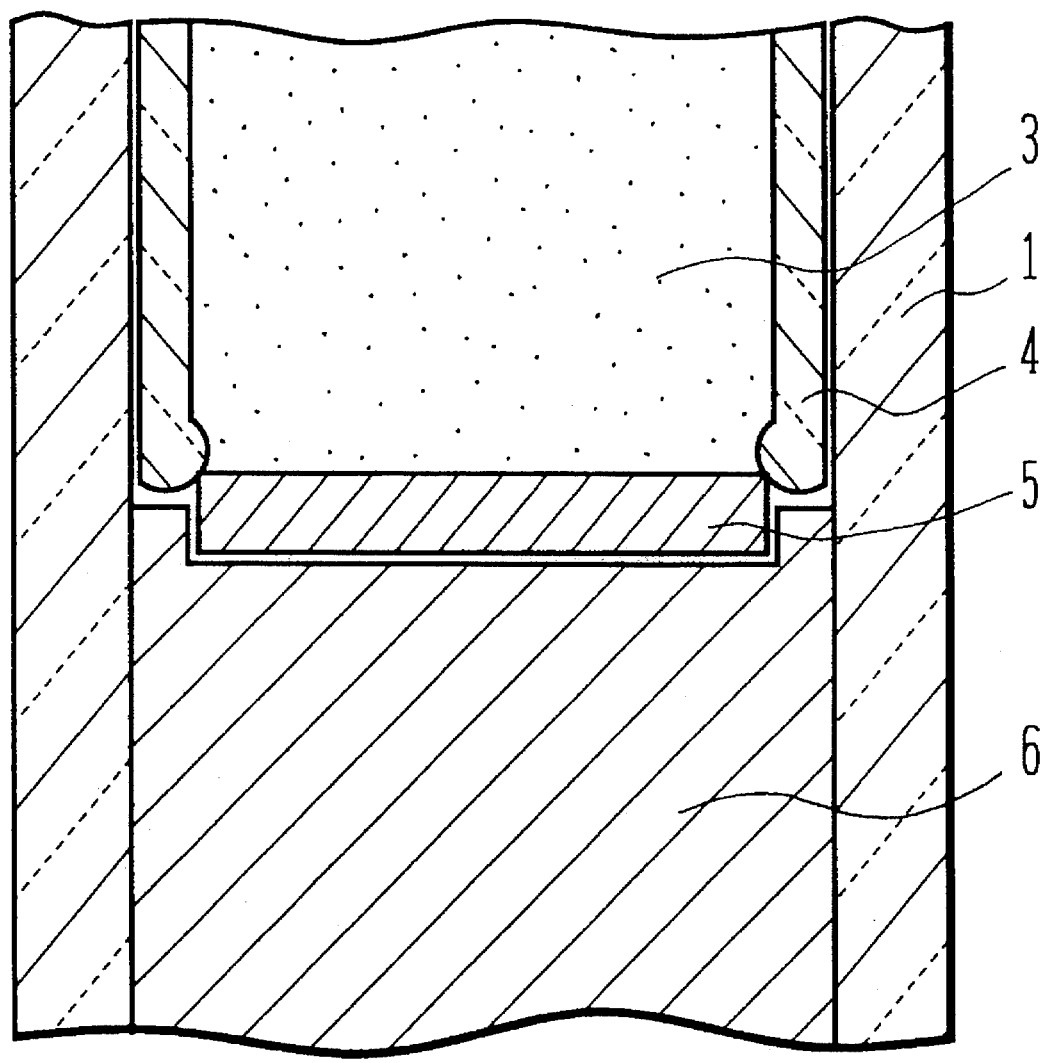
FIG. 2 is a cross section showing a method of fixing a seed crystal according to the embodiment shown in FIG. 1.

FIG. 2 is an enlarged cross sectional view showing the end of the seed stopper 4 on the seed crystal side. The seed crystal 5 is being placed centrally of the top surface of the heat sink 6. The top surface of the seed crystal 5 is preferably higher than the top surface of the heat sink 6. The inner circumferential edge of the seed stopper 4 is rounded by a burner to form a region having a diameter slightly smaller than the seed crystal 5. This region ensures to reliably fix the seed crystal 5.

The region may not be formed over the whole circumferential edge of the seed stopper 4, but at least two or more inward protrusions may be used for fixing the seed crystal 5. At least the inner surface of the seed stopper 4 is preferably made smooth.

Thereafter, a mixture of Se-Te having a predetermined composition ratio as a solvent 3 and a ZnSe polycrystal as a source crystal 2 are loaded in the crystal growth tube 1. The source crystal 2 is held by using a stepped portion of the crystal growth tube 1. The crystal growth tube 1 loaded with the source crystal 2 and solvent 8 is coupled to a vacuum pump to evacuate the inside of the tube 1 to a vacuum degree higher than $2\times10^{-6}$ Torr, and the opening is hermetically sealed.

The crystal growth tube 1 prepared as above is placed in an electric furnace set with a temperature gradient shown at the right side of FIG. 1. The electric furnace has a furnace tube 7 and a heater wire 8 wound around the tube 7. The crystal growth tube 1 is placed in a vertical space of the furnace tube 7.

In the electric furnace, the temperature at the position where the source crystal 2 is placed, is represented by Ts, and the temperature at the surface of the seed crystal 5 on which crystal grows, is represented by Tg.

The source crystal 2 at the source temperature Ts dissolves in the solvent 3 to the saturated solubility. Source crystal compositions dissolved in the solvent 8 move to the lower temperature area by diffusion so that the solution at the lower temperature area becomes oversaturated because of a low saturated solubility at the lower temperature area.

As the seed crystal 5 at the lower temperature area contacts the oversaturated solution having a proper oversaturated solubility, a ZnSe bulk single crystal grows on the surface of the seed crystal 5. The grown crystal has a cylindrical shape having the same diameter as the inner diameter of the seed stopper 4, and has the same diameter as the seed crystal 5.

The inner circumferential edge of the seed stopper 4 melted by a burner and made round has a smooth surface so that crystal growth progresses in conformity with the rounded inner surface of the seed stopper 4.

Figure 3A:
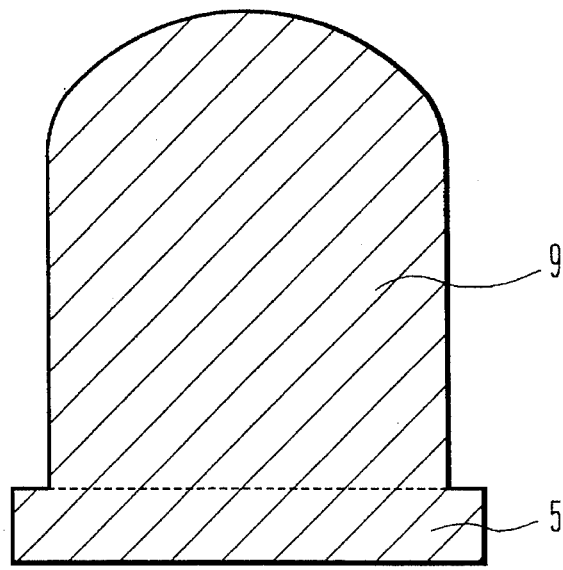
FIG. 3A (Prior Art) is a cross sectional view of a crystal grown by a conventional crystal solution growth method.
Figure 3B:
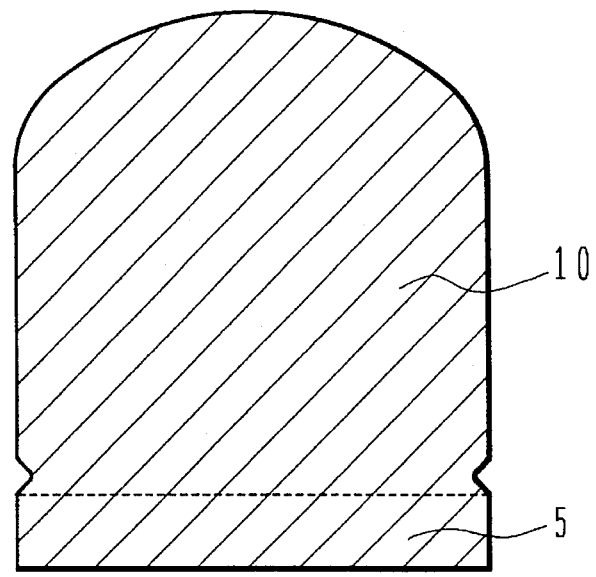
FIG. 3B is a cross sectional view of a crystal grown by a crystal solution growth method of the embodiment shown in FIG. 1.
Figure 8:
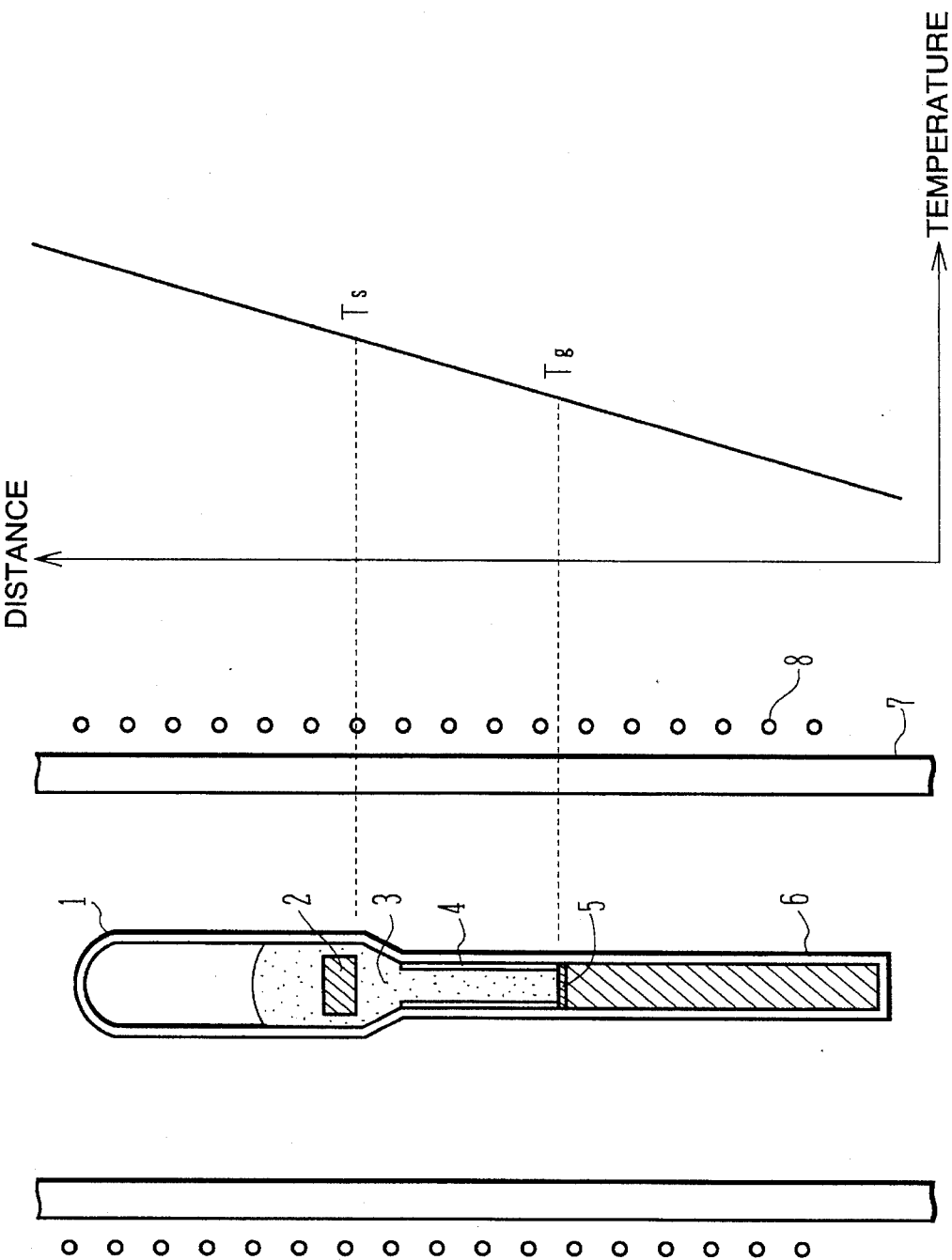
FIG. 8 (Prior Art) is a cross sectional view of a crystal solution growth apparatus and a temperature distribution graph, showing a crystal solution growth according to a conventional technique.
Figure 9:
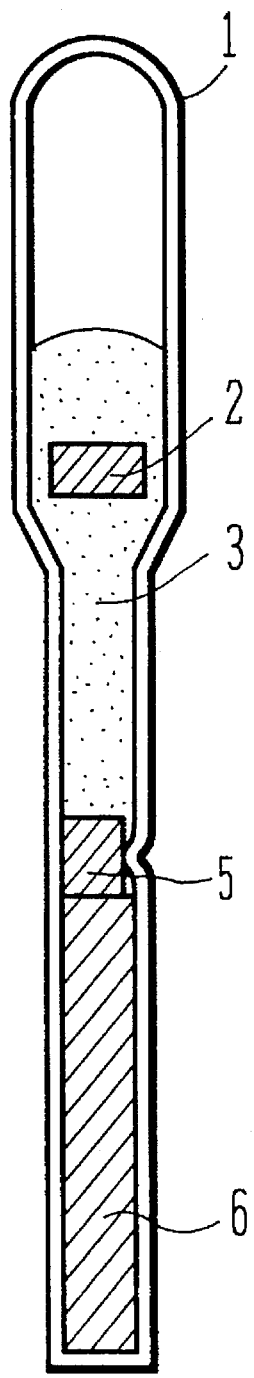
FIG. 9 (Prior Art) is a cross sectional view of a crystal solution growth apparatus having a different structure from that shown in FIG. 8, according to a conventional technique.

FIG. 3A is a schematic cross sectional view of a crystal grown by the conventional crystal solution growth method described with FIG. 8, and FIG. 3B is a schematic cross sectional view of a crystal grown by a crystal solution growth method of the embodiment.

The diameter of the cylindrical crystal 9 grown by the conventional method is smaller than that of the seed crystal 5. However, the diameter of the crystal 10 grown by the embodiment method is equal to that of the seed crystal 5. Although a recess is formed at the boundary between the grown crystal 10 and seed crystal 5 because of the projection of the seed stopper 4 for fixing the seed crystal, this projection poses no problem in growing a crystal, but a single crystal is grown in conformity with the inner surface of the seed stopper 4.

A wafer having the same diameter as the seed crystal can therefore be cut from the grown crystal 10. Since the diameter of a new seed crystal cut from the grown crystal does not reduce, crystal growth can be efficiently repeated.

In the above embodiment, a ZnSe crystal is grown by using a Se-Te solvent. The characteristic feature of the crystal solution growth of the embodiment resides in that the inner diameter of the seed stopper 4 is equal to the diameter of the seed crystal. This embodiment is therefore applicable not only to ZnSe crystal solution growth by using Se-Te solvent, but also to general crystal solution growth.

Next, another embodiment of the invention will be described with reference to FIG. 4 and FIGS. 5A and 5B.

Figure 4:
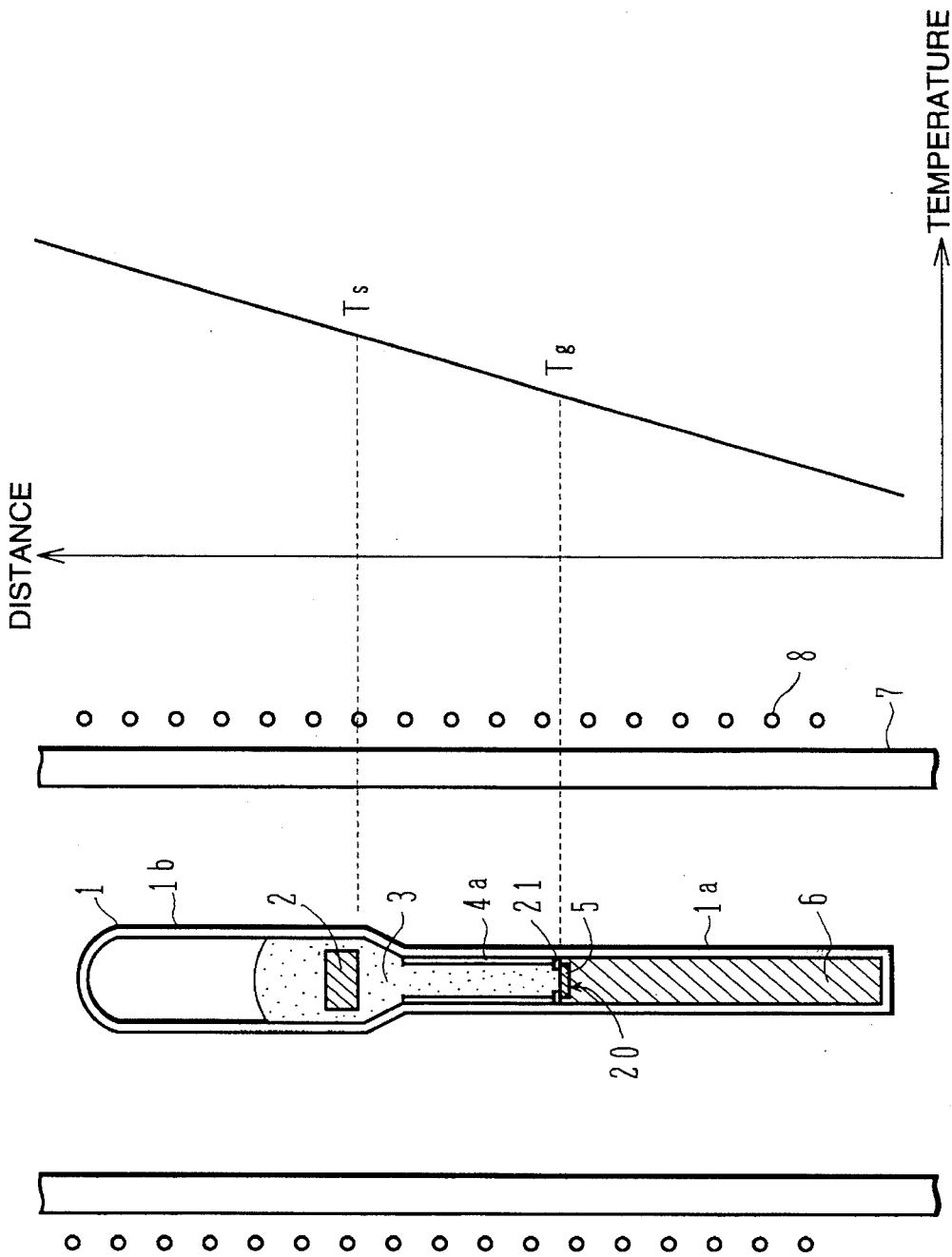
FIG. 4 is a cross sectional view of a crystal solution growth apparatus and a temperature distribution graph, showing a crystal solution growth according to another embodiment of the invention.

FIG. 4 shows a crystal growth apparatus according to the other embodiment of the invention. The left side of FIG. 4 is a cross sectional view of the crystal growth apparatus, and the right side thereof is a graph showing a temperature distribution in the furnace.

A crystal growth tube 1 assembled by coupling a quartz tube 1a having a small diameter and a quartz tube 1b having a large diameter, and a heat sink 6, have the same structures as the embodiment shown in FIG. 1.

The heat sink 6 has a circular recess 20 formed in the top surface and at the central area thereof, the circular recess 20 having a depth equal to, or slightly deeper than, the thickness of a seed crystal 5 and an inner diameter slightly larger than the diameter of the seed crystal 5. A difference between the depth of the recess 20 and the thickness of the seed crystal 5 is preferably 20 µm or less, as will be later described. The bottom of the recess 20 is worked to have a flat mirror surface.

As the seed crystal 5, a ZnSe single crystal wafer is prepared which is mirror-polished and washed to follow mirror etching. The seed crystal 5 is placed on the recess 20. Although the seed crystal has preferably the (1 1 1) plane, it may have another plane.

A ring 21 made of carbon or another material is placed on the heat sink 6, the ring 21 having an inner diameter slightly smaller than the diameter of the seed crystal 5, an outer diameter slightly smaller than the inner diameter of the quartz tube 1a, and a thickness of about several tens µm to several hundreds µm. A tubular seed stopper 4a made of quartz or another material is inserted and adhered to the crystal growth tube 1 by a melting process to fix the ring 21. The seed stopper 4a has an outer diameter same as the heat sink 6 and an inner diameter same as the diameter of the seed crystal 5.

The seed crystal 5 is substantially fixed by the ring 21 while leaving some clearance in the recess 20.

In this embodiment, for example, the seed crystal 5 has a diameter of 8 mm and a thickness of 500 µm, the recess 20 has an inner diameter of 8.2 mm and a depth of 500 to 520 µm, the ring 21 has an inner diameter of 7.7 mm and a thickness of 100 µm, and the seed stopper 4a has an inner diameter of 8 mm.

Thereafter, a mixture of Se-Te having a predetermined composition ratio as a solvent 3 and a ZnSe polycrystal as a source crystal 2 are loaded in the crystal growth tube 1. The crystal growth tube 1 loaded with the source crystal 2 and solvent 3 is coupled to a vacuum pump to evacuate the inside of the tube 1 to a vacuum degree higher than $2 \times 10^{-6}$ Torr, and the opening is hermetically sealed.

The crystal growth tube 1 is turned upside down or tilted to separate the seed crystal from the solvent, and the tube 1 is maintained at a predetermined temperature for a predetermined time to dissolve the source crystal ZnSe in the solvent 3 to a saturated solubility. Thereafter, the crystal growth tube 1 is set upright to make the saturated solution contact with the seed crystal. The source crystal 2 left undissolved is held by a stepped portion of the crystal growth tube 1.

Next, the crystal growth tube 1 is placed in an electric furnace set with a temperature distribution shown at the right side of FIG. 4. The electric furnace has the structure similar to that used by the embodiment shown in FIG. 1.

A ZnSe bulk single crystal grows on the surface of the seed crystal 5, based upon the same principle as the embodiment shown in FIG. 1. At the initial growth stage, the single crystal grows in conformity with the inner surface of the ring 21. After the thickness of the single crystal becomes greater than the thickness of the ring 21, the single crystal grows in conformity with the inner surface of the seed stopper 4a. In this manner, the ZnSe bulk single crystal is grown which has a cylindrical shape having the same diameter as the inner diameter of the seed stopper 4a, and has the same diameter as the seed crystal 5.

Figure 5A:
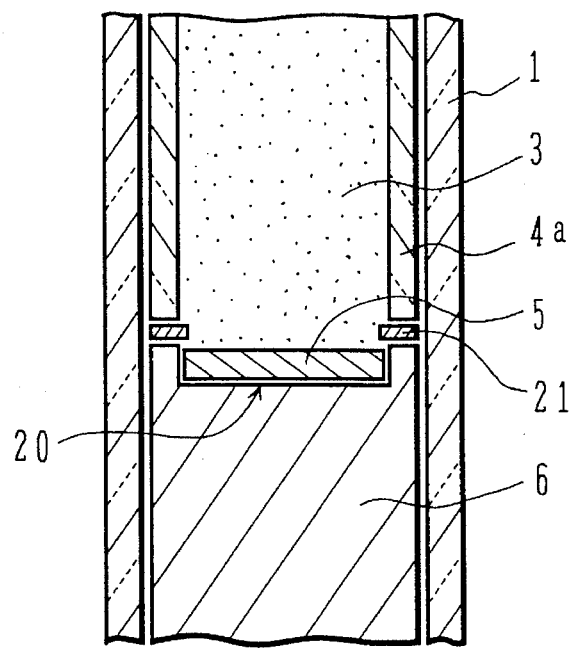
FIGS. 5A and 5B are enlarged cross sectional views of the region near a seed crystal stopper of the crystal solution growth apparatus of the embodiment shown in FIG. 4.

FIG. 5A is an enlarged cross sectional view of the region near the seed crystal stopper.

The seed crystal 5 is placed on the recess 20 formed in the top surface of the heat sink 6. The ring 21 is placed on the heat sink 6, and pushed and fixed by the seed stopper 4a.

The thermal expansion coefficients of the heat sink 6 and seed crystal 5 used in the embodiment are generally in the same order. The expansion amounts of the seed crystal 5 and the circumferential heat sink wall defining the recess 20 of the heat sink 6 are therefore in the same order in the vertical direction. Most of the compression stress from the seed stopper 4a are exerted to the circumferential heat sink wall defining the recess 20 to thereby relieve the stress applied to the seed crystal 5.

The thermal expansion coefficient of carbon is $7.9 \times 10^{-6}$/K which is nearly equal to the ZnSe thermal expansion coefficient $7.55 \times 10^{-6}$/K of ZnSe. Use of carbon as the material of the heat sink therefore enhances the stress relieving effect.

It is possible to prevent the crystal structure from being degraded by a stress-strain of the seed crystal during crystal growth, and to obtain a grown crystal having a good crystal structure.

The half band width of a rocking curve of a grown crystal measured by high resolution X-ray diffractometry was 5 to 8 seconds like the seed crystal.

According to this embodiment, the crystal structure of a grown crystal can be considerably improved as compared to the embodiment method described with FIG. 1. A grown crystal has the crystal structure like a seed crystal according to an evaluation by a half band width of a rocking curve obtained by X-ray diffractometry.

If the depth of the recess 20 is greater than the thickness of the seed crystal 5 by 20 µm or more, solvent moves lower to the bottom of the seed crystal 5. The solvent moving to the bottom of the seed crystal has a temperature gradient so that the seed crystal at the high temperature area dissolves and precipate on the heat sink at the lower temperature area. Furthermore, if the seed crystal 5 is tilted by the solvent moving to the bottom thereof, the crystal plane of a grown crystal is tilted from the main axial direction. Conversely, if the depth of the recess 20 is smaller than the thickness of the seed crystal 5, the ring 21 floats over the heat sink 6 so that all the stress is exerted to the seed crystal 5, degrading the crystal structure.

It is therefore preferable that the depth of the recess 20 is equal to the thickness of the seed crystal 5, or even if the depth is greater than the thickness of the seed crystal 5, a difference between the depth and the thickness is set to 20 µm or less. With the difference of 20 µm or less, solution will not enter a space between the seed crystal and the heat sink because of the surface tension of the solution.

The inner circumferential edge of the seed stopper 4a of this embodiment is worked only to have a vertical plane, allowing a high precision work. As a result, the outer periphery of the seed crystal can be uniformly pushed and fixed.

In this embodiment, in order to relieve a stress caused by an expansion coefficient difference, a seed crystal is placed on a recess formed in the top surface of a heat sink, at generally the central area of the recess. It is not always necessary to use a recess. Instead, a member absorbing a stress may be placed at the peripheral area of a seed crystal.

Figure 5B:
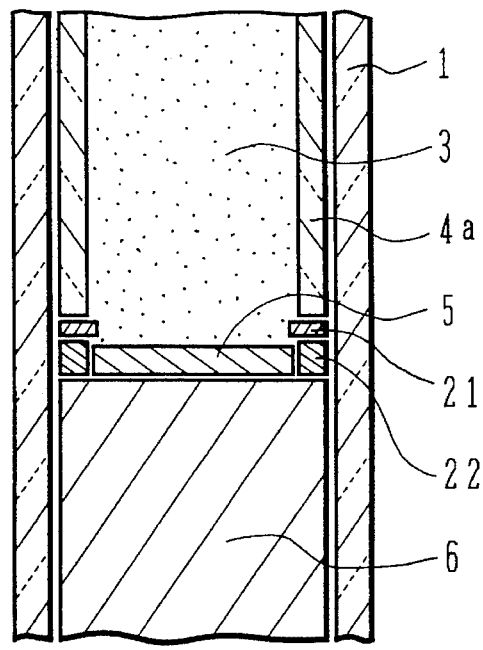

FIG. 5B is an enlarged cross sectional view of the region near the seed crystal stopper, wherein instead of forming a recess in the top surface of the heat sink, a ring is placed on the heat sink, the ring having an inner diameter slightly larger than the diameter of the seed crystal.

A ring 22 made of carbon or another material is placed on a heat sink 6 worked to have a flat mirror surface. The inner diameter of the ring 22 is slightly larger than the diameter of a seed crystal 5, and the outer diameter thereof is generally the same as the outer diameter of the heat sink 6. The thickness of the ring 22 is generally the same as, or slightly greater than, the seed crystal 5. A thickness difference between the seed crystal 5 and the ring 22 is preferably 20 µm or less similar to the depth of the recess shown in FIG. 5A.

The seed crystal 5 is placed on the heat sink 6 and in the opening of the ring 22. Similar to the embodiment shown in FIG. 5A, a ring 21 and a seed stopper 4a are placed in this order on the ring 22. The ring 21 has an inner diameter slightly smaller than the outer diameter of the seed crystal, and the seed stopper 4a has an inner diameter generally the same as the diameter of the seed crystal. The seed stopper 4a is adhered to the quartz tube 1 by a melting process to fix the rings 21 and 22.

For example, the seed crystal 5 has a diameter of 8 mm and a thickness of 500 µm, the ring 22 has an inner diameter of 8.2 mm and a thickness of 500 to 520 µm, the ring 21 has an inner diameter of 7.7 mm and a thickness of 100 µm, and the seed stopper 4a has an inner diameter of 8 mm.

The fundamental structure of the crystal growth tube is the same as the structure shown in FIG. 5A, except that the circumferential heat sink wall defining the recess 20 shown in FIG. 5A is replaced by the ring 22. The same advantageous effects as the embodiment shown in FIG. 5A can therefore be obtained.

In thee above embodiment, a ZnSe crystal is grown by using a Se-Te solvent. The characteristic feature of the crystal solution growth of the embodiment resides in that a stress applied to a seed crystal is relieved by disposing a member at the periphery of the seed crystal, the member having generally the same thermal expansion coefficient as the seed crystal. This embodiment is therefore applicable not only to a ZnSe crystal solution growth by using a Se-Te solvent but also to general crystal solution growth for a group II–VI compound semiconductor.

Next, still another embodiment of the invention will be described with reference to FIGS. 6 and 7.

Figure 6:
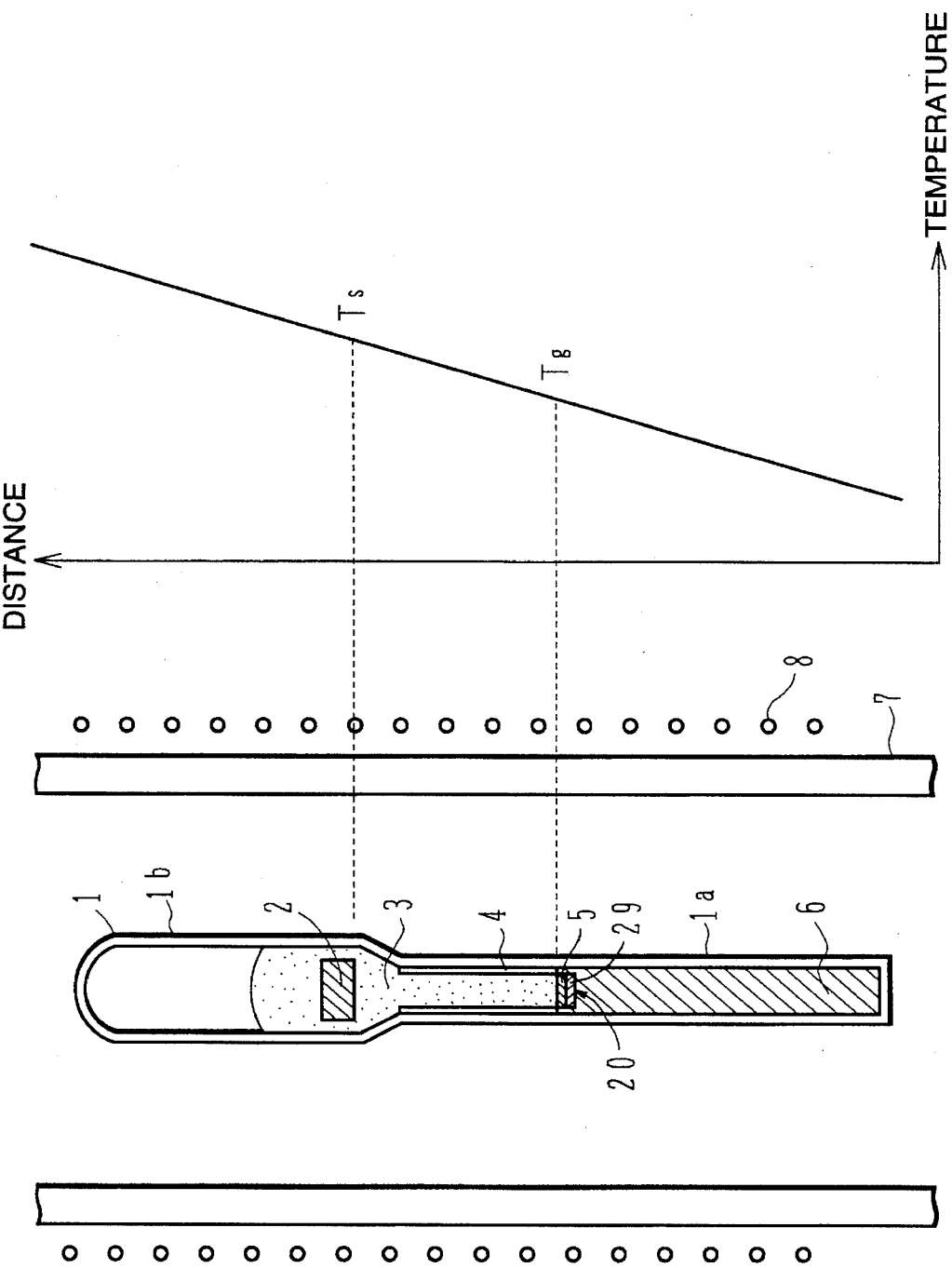
FIG. 6 is a cross sectional view of a crystal solution growth apparatus and a temperature distribution graph, showing a crystal solution growth according to still another embodiment of the invention.

FIG. 6 shows a crystal growth apparatus according to the other embodiment of the invention. The left side of FIG. 6 is a cross sectional view of the crystal growth apparatus, and the right side thereof is a graph showing a temperature distribution in the furnace.

A crystal growth tube 1 assembled by coupling a quartz tube 1a having a small diameter and a quartz tube 1b having a large diameter, and a heat sink 6, have the same structures as the embodiment shown in FIG. 1.

The heat sink 6 has a circular recess 20 formed in the top surface and at the central area thereof, the circular recess 20 having a depth of about 0.5 mm. The bottom of the recess 20 is worked to have a flat mirror surface.

As the seed crystal 5, a ZnSe single crystal wafer is prepared which is mirror-polished and washed to follow mirror etching. The seed crystal 5 has a diameter slightly smaller than the diameter of the circular recess 20.

A zinc (Zn) plate 29 is placed on the recess 20 of the heat sink 6. The Zn plate 29 has a diameter slightly smaller than the diameter of the recess 20 and a thickness of 100 to 300 µm. A seed crystal 5 is placed on the Zn plate 29.

A cylindrical seed stopper 4 is inserted and adhered to the crystal growth tube 1 by a melting process to fix the seed crystal 5. The seed stopper 4 has the same outer diameter as the heat sink 6 and an inner diameter same as the diameter of the seed crystal 5. The inner circumferential edge of the seed stopper 4 has a round surface melted by a burner.

Thereafter, a mixture of a Se-Te having a predetermined composition as a solvent 3 and a ZnSe polycrystal as a source crystal 2 are loaded in the crystal growth tube 1. The crystal growth tube 1 loaded with the source crystal 2 and solvent 3 is coupled to a vacuum pump to evacuate the inside of the tube 1 to a vacuum degree higher than $2 \times 10^{-6}$ Torr, and the opening is hermetically sealed.

Similar to the embodiment shown in FIG. 4, ZnSe is dissolved in the solvent 3 to a saturated solubility to make the saturated solution contact with the seed crystal.

Figure 7:
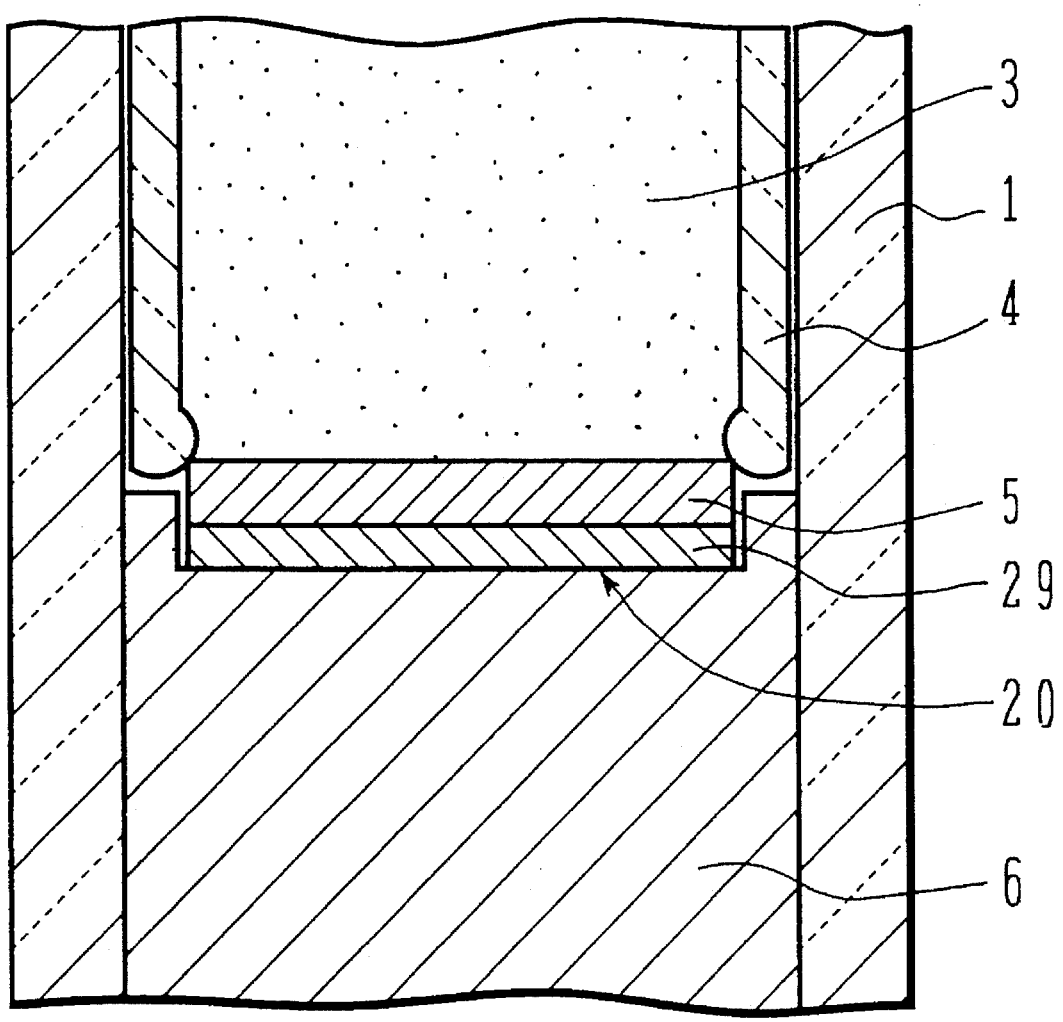
FIG. 7 is an enlarged cross sectional view showing a grown crystal in the crystal solution growth apparatus of the embodiment shown in FIG. 6.

Next, the crystal growth tube 1 is placed in an electric furnace set with a temperature distribution shown at the right side of FIG. 7. The electric furnace has a structure similar to that used by the embodiment shown in FIG. 1.

A ZnSe bulk single crystal having the same diameter as the seed crystal grows on the surface of the seed crystal 5, based upon the same principle as the embodiment shown in FIG. 1. The single crystal grows in conformity with the inner surface of the seed stopper 4 because of its smooth surface, melted and rounded by a burner, at the circumferential inner edge of the seed stopper 4.

FIG. 7 is an enlarged cross sectional view of the region near the seed stopper.

On the recess 20 of the heat sink 6, the Zn plate 29 and the seed crystal 5 are placed. The seed stopper 4 having an inner circumferential edge rounded by a burner fixes the seed crystal 5.

Contact of the seed crystal 5 with the carbon heat sink 6 can be improved by the Zn plate 29 under the seed crystal 5, as compared to the case where the seed crystal is placed directly on the heat sink 6. This improved contact is considered to be attributable to Zn being liquified at the crystal growth temperature and fills a clearance between the seed crystal 5 and the heat sink 6. It is therefore possible to prevent the solvent from moving lower to the bottom of the seed crystal 5.

Even if some clearance is present, the solvent which enters the clearance reacts with Zn, forming ZnSe. It is preferable that the Zn plate has an amount sufficient for the amount of the solvent moving lower to the bottom of the seed crystal 5. With a sufficient amount of Zn, the formed ZnSe is considered to be dissolved in the solution or changed in a solid phase ZnSe. Since the solubility of ZnSe into Zn is very low, the formed ZnSe hardly dissolves in the solution Zn. Accordingly, inclusions caused by diffusion of the solvent into the seed crystal can be avoided.

In this embodiment, the Zn plate 29 is placed in tight contact with the seed crystal 5. A Zn film may be formed on the bottom of the seed crystal to a thickness of 10 to 100 µm by sputtering or other methods. A Zn film formed on the bottom of the seed crystal by sputtering or other methods prevents even a small clearance from being formed on the bottom of the seed crystal. A Zn film may be formed on the recess of the heat sink.

In the above embodiment, ZnSe crystal is grown by using a Se-Te solvent. The characteristic feature of the crystal solution growth of the embodiment resides in that one constituent clement of a seed crystal contained in the solvent is reacted with another other constituent element member in contact with the bottom of the seed crystal. This embodiment is therefore applicable not only to ZnSe crystal solution growth by using a Se-Te solvent, but also to general crystal solution growth for a group II–VI compound semiconductor.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A crystal solution growth method for growing a crystal comprising:

(a) placing a seed crystal on a recess disposed on a top surface of a heat sink, said heat sink being disposed under a solvent, said solvent having a higher region and a lower region;

(b) fixing the seed crystal to said heat sink by placing a seed stopper on the seed crystal, said seed stopper having (i) a tubular part with an inner diameter the same as a diameter of the seed crystal and (ii) a seed crystal fixing part for fixing the seed crystal, said seed crystal fixing part being disposed at one end of the tubular part facing the seed crystal;

(c) disposing a source crystal in the higher region of said solvent, (d) causing a temperature difference between the higher region of the solvent, corresponding to a high temperature region and a lower region of the solvent corresponding to a low temperature region, said seed crystal being disposed in the low temperature region of said solvent and said source crystal being disposed in the high temperature region of said solvent and (e) growing a crystal on the surface of the seed crystal.

2. The method according to claim 1, wherein the seed crystal fixing part of said seed stopper is a projection formed at the one end of the tubular part on the seed crystal side, the projection extending inward of the tubular part.

3. The method according to claim 1, wherein the seed crystal fixing step (b) includes the steps of:

placing said seed crystal fixing part having an opening on said heat sink, with said opening being disposed concentrically with said recess, said opening having a diameter slightly smaller than the diameter of the seed crystal; and fixing said seed crystal fixing part by said tubular part.

4. The method according to claim 3, wherein said recess is formed in the top surface of said heat sink, the diameter of said recess is slightly larger than the diameter of the seed crystal, and the depth thereof is equal to the thickness of the seed crystal, or larger than the thickness with a difference therebetween being 20 µm or less.

5. The method according to claim 3, wherein said heat sink comprises a main body having a flat top surface, and a subsidiary member having an opening with a diameter slightly larger than the diameter of the seed crystal, and having a thickness equal to the thickness of the seed crystal, or larger than the thickness with a difference therebetween being 20 µm or less, and the seed crystal placing step (a) includes the steps of:

placing the subsidiary member on the main body of the heat sink; and placing the seed crystal on said main body of said heat sink and in said opening of said subsidiary member.

6. The method according to claim 1, wherein the crystal is a group II–VI compound semiconductor.

7. The method according to claim 6, wherein the compound semiconductor is ZnSe and the seed crystal is a ZnSe single crystal wafer.

8. The method according to claim 7, wherein the solvent is Se-Te.

9. The method according to claim 8, wherein the heat sink is made of carbon.

10. The method according to claim 1, wherein the recess of the heat sink is 0.1 to 0.5 mm.

11. A crystal solution growth method comprising:

(a) causing a temperature difference between a higher region corresponding to a high temperature region and a lower region of a solvent corresponding to a low temperature region, said solvent including at least one first constituent element of a compound semiconductor crystal to be grown, (b) disposing a source crystal in the high temperature region of the solution, (c) placing a member containing a second constituent element different from said at least one first constituent element of the crystal to be grown, and a seed crystal, in this order, respectively on a top surface of a heat sink disposed under the solvent and in the low temperature region;

(d) arranging a tubular seed stopper so as to press against an outer periphery of said seed crystal to fix said seed crystal to said heat sink; and (e) growing a single crystal from the resultant solution on a surface of said seed crystal.

12. The crystal solution growth method according to claim 11, wherein said seed crystal placing step (d) includes a step of placing said member on the top surface of said heat sink and a step of placing said seed crystal on said member.

13. The crystal solution growth method according to claim 11, wherein said seed crystal being provided with a thin film made of said second constituent element on a surface of said seed crystal, and said thin film being in contact with the top surface of said heat sink.

14. The method according to claim 13, wherein the thin film is a Zn thin film.

15. The crystal solution growth method according to claim 11, wherein said tubular seed stopper has an inner diameter equal to a diameter of said seed crystal and a projection extending inward toward the periphery of said seed crystal.

* * * * *